United States Patent [19]

Ta

[11] Patent Number: 5,293,166
[45] Date of Patent: Mar. 8, 1994

[54] DIGITAL-TO-ANALOG CONVERTER AND BIAS COMPENSATOR THEREFOR

[75] Inventor: Paul D. Ta, San Jose, Calif.

[73] Assignee: VLSI Technology, Inc., San Jose, Calif.

[21] Appl. No.: 860,946

[22] Filed: Mar. 31, 1992

[51] Int. Cl.⁵ ................... H03M 1/66; H03M 1/06
[52] U.S. Cl. .................... 341/118; 341/136; 341/144
[58] Field of Search .............. 341/118, 144, 136, 134, 341/154

[56] References Cited

U.S. PATENT DOCUMENTS

| | | | |
|---|---|---|---|
| 4,543,561 | 9/1985 | Holloway. | |
| 4,766,415 | 8/1988 | Dielacher | 341/136 X |
| 4,827,260 | 5/1989 | Sugawa et al. | 341/118 |
| 5,023,614 | 6/1991 | Fung et al. | 341/144 |
| 5,036,322 | 7/1991 | Barrow et al. | 341/155 |
| 5,136,293 | 8/1992 | Matsuo et al. | 341/144 |
| 5,146,223 | 9/1992 | Muto | 341/155 X |

Primary Examiner—Sharon D. Logan
Attorney, Agent, or Firm—Hickman & Beyer

[57] ABSTRACT

A digital-to-analog (D/A) converter characterized by a decoder which decodes a multi-bit digital input into a plurality of cell activation signals; a converter comprising a number of current cells which can be individually activated by respective cell activation signals; a bias generator which develops a bias voltage for the current cells; and a compensator which compensates the bias voltage to reduce the effects of voltage variations in the power supply. The compensator includes a variation detector coupled to the power supply and develops an error signal when the power supply voltage fluctuates. A variation compensator is responsive to the error signal and is operative to stabilize the bias level. The method of the present invention includes the steps of developing a bias voltage from a power supply, sensing voltage variations in the power supply, and compensating the bias voltage to counteract the effects of the voltage variations.

9 Claims, 4 Drawing Sheets

DIGITAL-TO-ANALOG CONVERTER AND BIAS COMPENSATOR THEREFOR

BACKGROUND OF THE INVENTION

This invention relates generally to electronic circuitry and more particularly to digital-to-analog converters.

Digital-to-analog (D/A) converters are used to convert digital data to an analog equivalent. For example, a D/A converter for a video board of a personal computer (PC) will convert digital video data generated by the PC into analog signals which can drive a video display. Since modern color video displays can display hundreds or even thousands of hues and intensities, it is important that the D/A conversion be very accurate to avoid errors in the displayed image.

In FIG. 1, a prior art video D/A converter 10 is shown which may be advantageously implemented in complementary metal oxide semiconductor (CMOS) technology. The D/A converter 10 includes a decoder 12, an array 14 of current cells 16, and a bias generator 18. Digital data from a data bus 20 is applied to decoder 12 which selectively activates one or more current cells 16 to produce an analog signal on analog output line 22.

Each of the current cells 16 includes a current source MOSFET (metal oxide semiconductor field effect transistor) 24 and two switch MOSFETS 26 and 28. MOSFETS 24, 26 and 28 are all p-channel devices. The source of MOSFET 24 is coupled to the $V_{dd}$ terminal of a power supply and its gate is coupled to a bias line 30. The sources of MOSFETS 26 and 28 are coupled to the drain of MOSFET 24, the drain of MOSFET 26 is coupled to ground, and the drain of MOSFET 28 is coupled to analog output line 22.

The number n of cells 16 is related to the number of bits b in data bus 20 by the relationship $n=2^b$. If, for example, the data bus 20 is 4 bits wide, there will be $n=2^4=16$ of the current cells 16.

The gate of MOSFET 26 of each current cell 16 is coupled to the output of decoder 12 by a line A and the gate of MOSFET 28 of each current cell 16 is coupled to line A by an inverter 32. The line A a first current cell 16 is labelled $A_1$ while the line A of the $n^{th}$ current cell 16 is labelled $A_n$. When the decoder 12 applies a low voltage (LO) signal to a line A, the MOSFET 26 will turn on and MOSFET 28 will turn off with the result that the current provided by MOSFET 24 will flow to ground. When a high voltage (HI) signal is applied to a line A, the MOSFET 26 will turn off and the MOSFET 28 will turn on, resulting in a current will flowing through output line 22 and a resistor $R_{load}$ to ground. As will be discussed in greater detail subsequently, the number of current cells which are activated at any one time correspond to the numeric value of the datum on data bus 20.

Bias generator 18 produces a bias voltage on bias line 30 which controls the current sources 24 of the current cells 16. This prior art bias generator 18 includes an operational amplifier (opamp) 34, a p-channel MOSFET 36, and a resistor $R_{ref}$. One input of the opamp 34 is coupled to an external reference voltage $V_{ref}$ and the other input of opamp 34 is coupled to bias line 30. The source of MOSFET 36 is coupled to $V_{dd}$, its drain is coupled to bias line 30, and its gate is coupled to the output of opamp 34. $R_{ref}$ is coupled between bias line 30 and ground.

As long as $V_{dd}$ and $V_{ref}$ are stable, the bias generator 18 serves to provide a substantially constant voltage equal to $V_{ref}$ on bias line 30. If the voltage on bias line 30 rises above $V_{ref}$, the positive input to opamp 34 is greater than the negative input, causing the output of opamp 34 to become more positive and thereby reducing the current $I_{ref}$ flowing through MOSFET 36 and pulling down the voltage on bias line 30 to $V_{ref}$. If the voltage on bias line 30 falls below $V_{ref}$, the positive input to opamp 34 is less than the negative input, causing the output of opamp 34 to increase the current $I_{ref}$ flowing through MOSFET 36 and thereby pulling up the voltage on bias line 30 to $V_{ref}$.

The ideal performance of a MOSFET 24 of a current cell 16 is illustrated in FIG. 2a. When the power supply voltage $V_{dd}$ is zero, the current $I_c$ is also zero. The current $I_c$ then rises substantially linearly until $V_{dd}$ reaches a threshold voltage $V_{dsat}$ at which time $I_c$ becomes a constant. In other words, $I_c$ is ideally independent of $V_{dd}$ as long as $V_{dd}$ is greater than the threshold voltage $V_{dsat}$ of the MOSFET 24. Therefore, if $V_{dd}$ is chosen to be sufficiently greater than $V_{dsat}$, minor variations in the power supply voltage will not, in theory, effect the output of the MOSFET 24.

While the performance of MOSFET 24 approaches the ideal depicted in FIG. 2a, its performance is more realistically depicted in the graph of FIG. 2b. Again there is a substantially linear relationship between $V_{dd}$ and $I_c$ between $0 < V_{dd} < V_{dsat}$. However, at voltages $V_{dd} > V_{dsat}$ the current $I_c$ through MOSFET 24 increases substantially linearly with increasing $V_{dd}$, albeit at a lesser rate than when $V_{dd}$ is less than $V_{dsat}$. In consequence, a voltage variation v in $V_{dd}$ will result in an error current e in $I_c$. Since the outputs of all of the current cells 16 are coupled together in parallel, this will result in a cumulative error current $E=e2^b$, which can be quite substantial.

A prior art solution to this problem is to provide a cascode current source comprising two rather large MOSFETS coupled in series. While this solution does reduce errors caused by voltage variations in the source, it comes at the price of increasing the device count and real-estate usage of the circuit, and tends to slow the operation of the circuit.

SUMMARY OF THE INVENTION

A digital-to-analog (D/A) converter in accordance with the present invention includes a decoder, a converter, a bias generator, and a bias compensator. The decoder decodes a multi-bit digital input into a number of cell activation signals. The converter includes a number of current cells which can be individually activated by the cell activation signals produced by the decoder. The bias generator provides a bias voltage on a bias line for the current cells, and the bias compensator maintains a constant voltage on the bias line by compensating for variations in power supply voltage.

The bias compensator includes a variation detector which produces an error signal when there is a variation of the power supply voltage and a variation compensator which is responsive to the error signal and operative to compensate for the effects of the voltage variation on the bias line.

The method of the present invention includes the steps of developing a bias voltage from a power supply, sensing voltage variations on the power supply, and compensating the bias voltage to counteract the effects of the voltage variations. The voltage variations are preferably sensed by comparing an output of a pseudo circuit coupled to the power supply against the output of a reference circuit coupled to the power supply to develop an error signal.

The apparatus and method of the present invention provide a D/A converter which is relatively immune to variations of the power supply voltage level. The apparatus and method further do not suffer from the disadvantages of cascode current sources.

These and other advantages of the present invention will become apparent to those skilled in the art upon a reading of the following specification of the invention and a study of the several figures of the drawing.

DETAILED DESCRIPTION OF THE PREFERRED EMBODIMENTS

Figure 1:
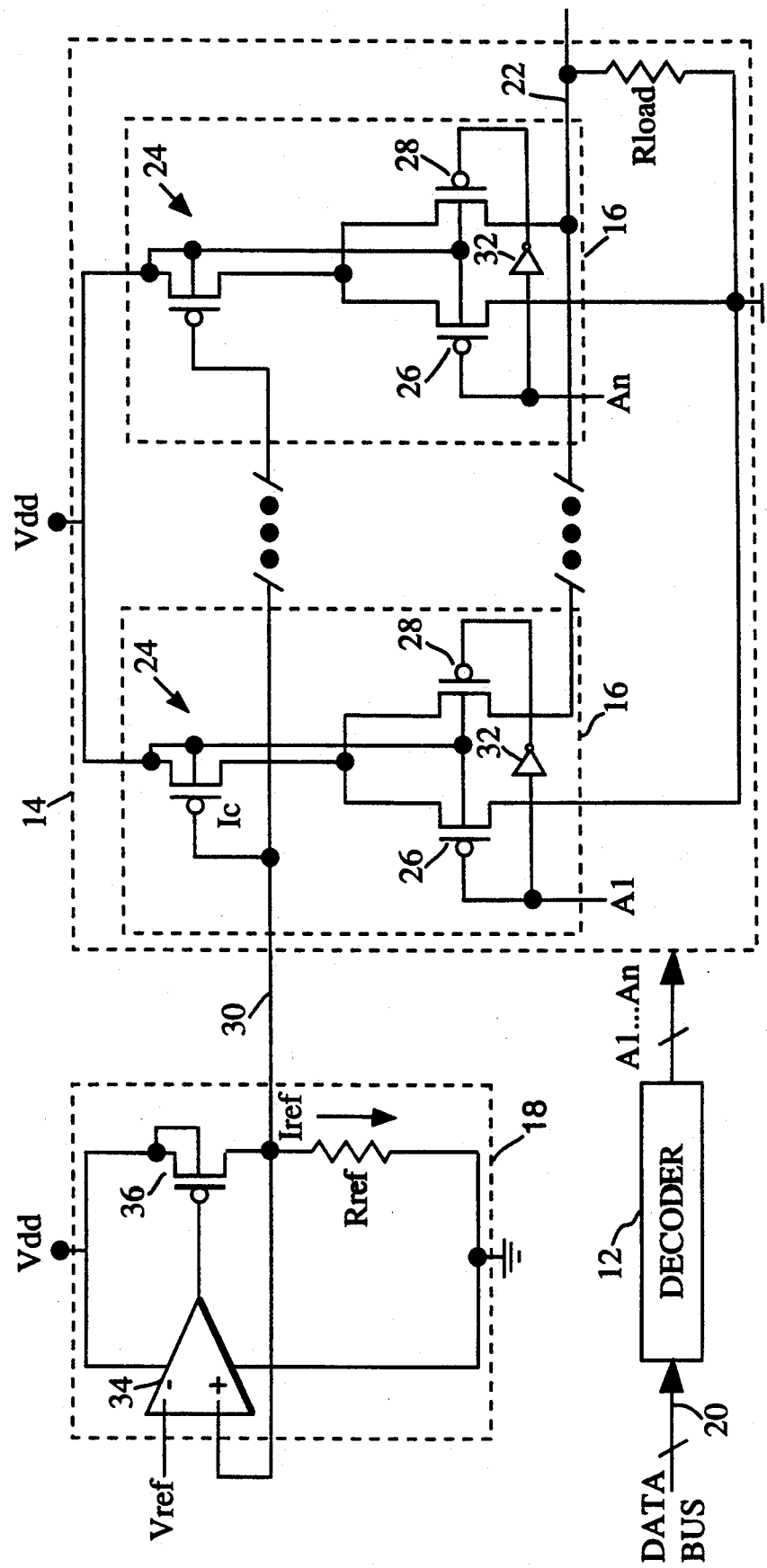
FIG. 1 is a schematic of a prior art digital to analog (D/A) converter.
Figure 2A:
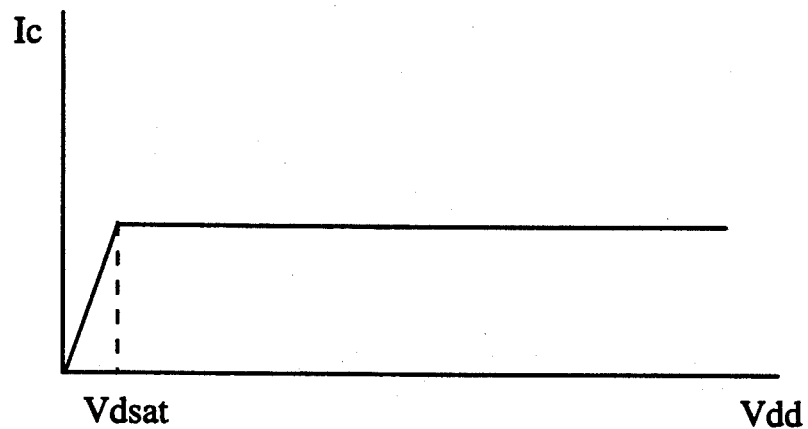
FIG. 2a is a graph illustrating ideal current/voltage characteristics of a current source of the D/A converter of FIG. 1.
Figure 2B:
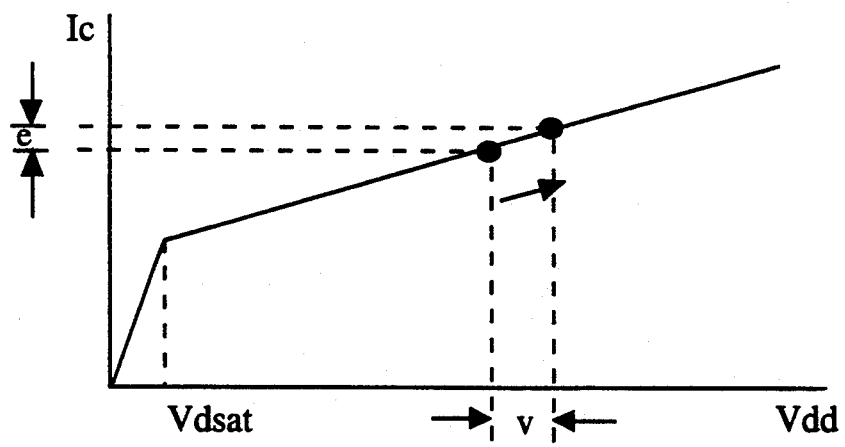
FIG. 2b is a graph which more realistically depicts the current/voltage characteristics of a current source of the D/A converter of FIG. 1.
Figure 3:
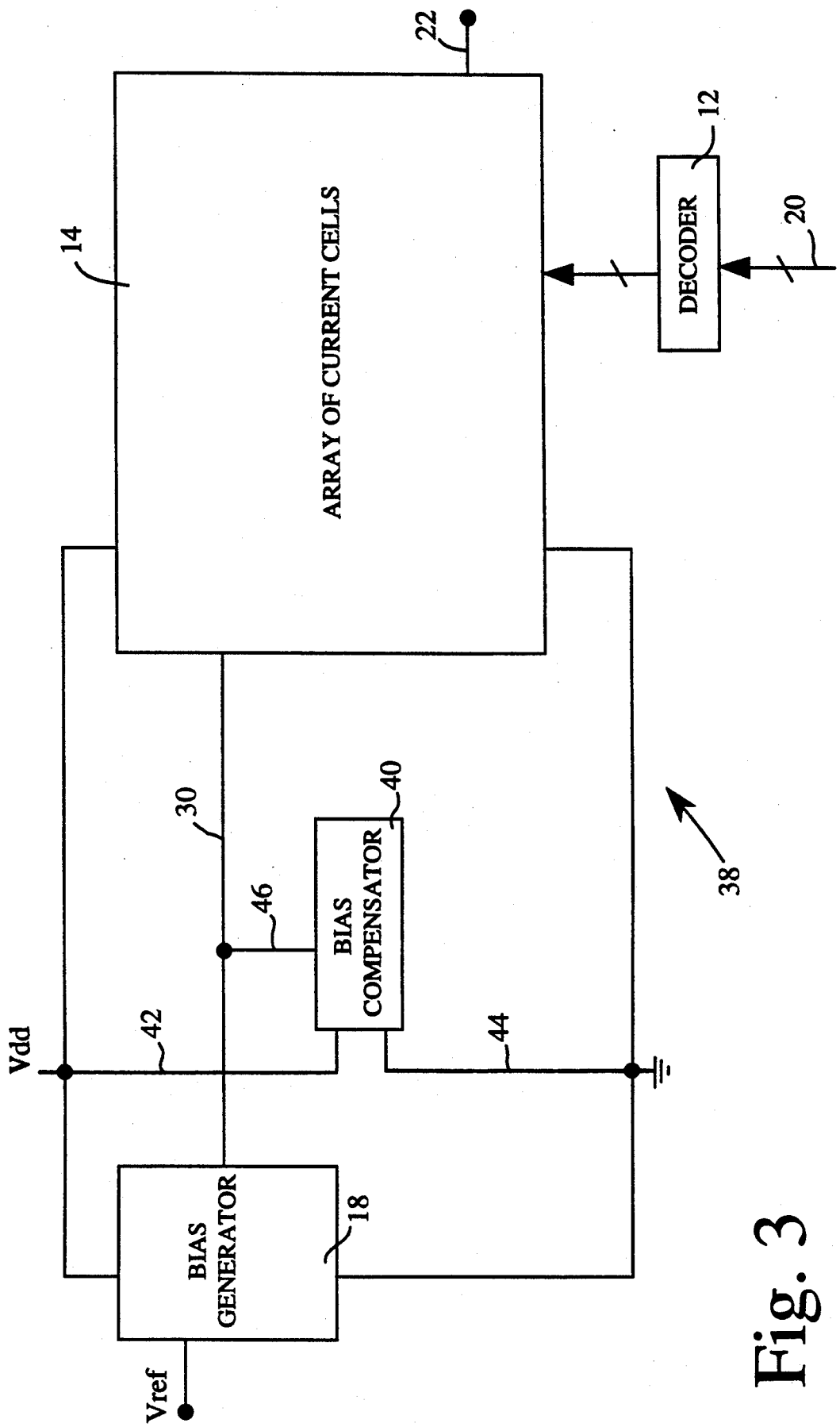
FIG. 3 is a block diagram of a digital-to-analog converter in accordance with the present invention.

FIG. 1 illustrates a prior art digital-to-analog (D/A) converter 10 and FIGS. 2a and 2b respectively illustrate the theoretical and more realistic operating characteristics of a current source of the converter 10. In FIG. 3, a D/A converter 38 in accordance with the present invention includes a decoder 12, a bias generator 18, and an array 14 of current cells which operate as previously described with reference to the prior art D/A converter 10. In addition, the D/A converter 38 of the present invention includes a bias compensator 40 coupled to $V_{dd}$ by a line 42, to ground by a line 44, and to the bias line 30 by a line 46. The bias compensator 40 detects voltage variations in the power supply $V_{dd}$ and stabilizes the bias on line 30 to compensate for these voltage variations.

Figure 4:
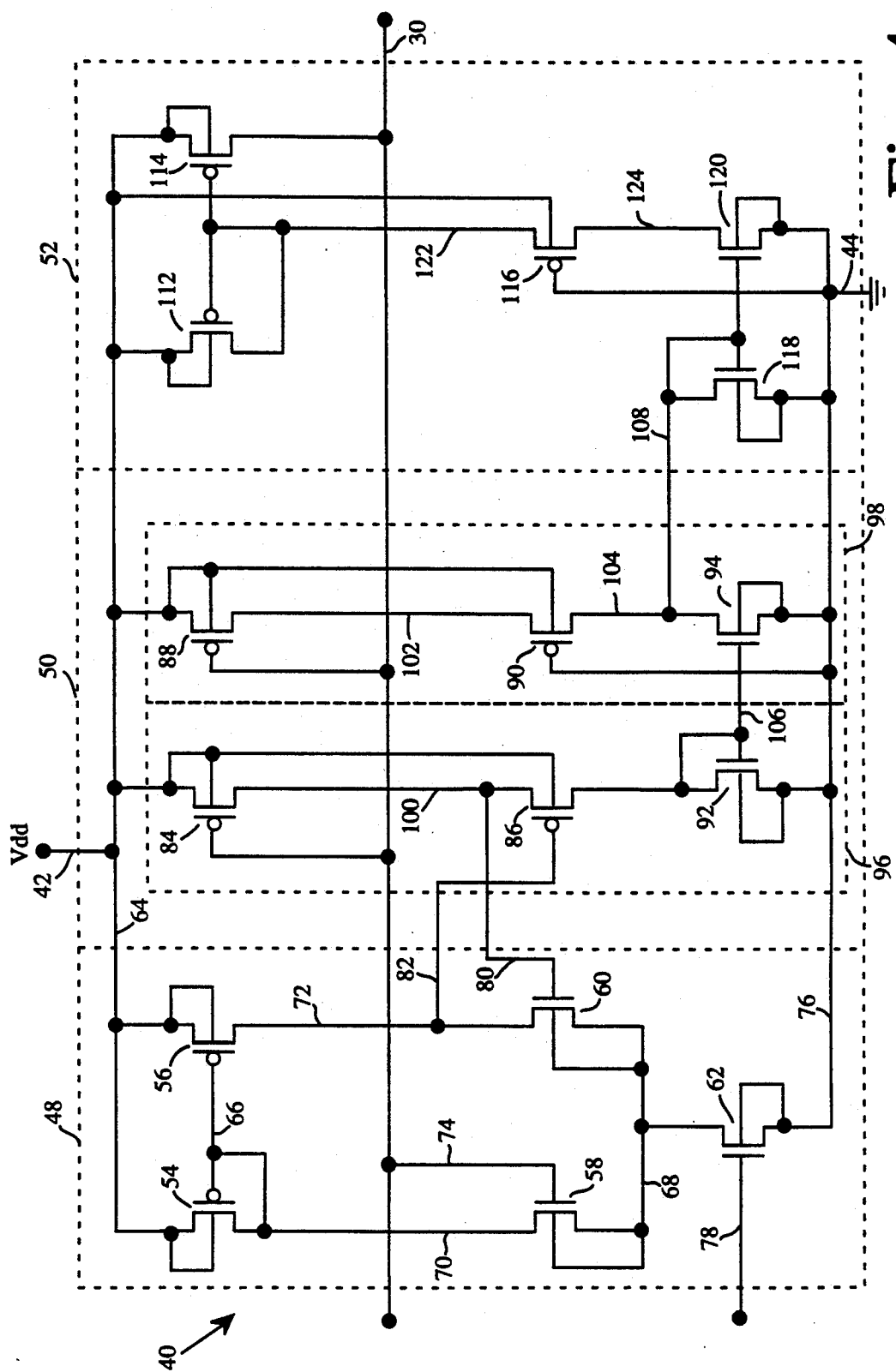
FIG. 4 is a schematic of a bias compensator for a digital-to-analog converter in accordance with the present invention.

FIG. 4 is a schematic diagram illustrating a preferred embodiment for the bias compensator 40. In this preferred embodiment, the bias compensator is implemented in complementary metal oxide semiconductor (CMOS) technology and includes three main sections: an operational amplifier (opamp) 48; a variation detector 50; and a variation compensator 52. The opamp 48 develops a compensation reference voltage for the variation detector 50. If a voltage variation on $V_{dd}$ is sensed by variation detector 50, the variation compensator 52 will compensate the bias on bias line 30 accordingly.

Opamp 48 includes two p-channel MOSFETS 54 and 56 and three n-channel MOSFETS 58, 60, and 62. The sources of MOSFETS 54 and 56 are coupled to $V_{dd}$ by a power line 64, and the gates of MOSFETS 54 and 56 are coupled together by a line 66. As such, MOSFETS 54 and 56 are current mirrors where the current $I_{drain}$ through those transistors is substantially the same. The sources of MOSFETS 58 and 60 are coupled together by a line 68 and are coupled to the respective drains of MOSFETS 54 and 56 by lines 70 and 72. The gate of MOSFET 58 is coupled to the bias line 30 by a line 74.

MOSFET 62 serves to enable or disable the opamp 48 and to thereby enable or disable the bias compensator 40. The drain of MOSFET 62 is coupled to line 68, and the source of MOSFET 62 is coupled to a ground line 76. A control line 78 is coupled to the gate of MOSFET 62. When a positive voltage greater than the gate threshold voltage level $V_{th}$ is applied to control line 78, MOSFET 62 turns on and the opamp 48 is enabled. In the absence of a voltage greater than $V_{th}$, MOSFET 62 turns off and the opamp 48 is disabled. With the opamp 48 disabled, the bias compensator 40 is disabled, and the D/A converter 38 operates in the same fashion as prior art D/A converter 10.

The positive or additive input to opamp 48 is coupled to the bias line 30, while the negative or subtracting input to the opamp 48 is coupled to the gate of MOSFET 60 by a line 80. The output of the opamp 48 is on a line 82 and provides a relatively stable reference voltage for variation detector 50.

Variation detector 50 includes four p-channel MOSFETS 84, 86, 88, and 90 and two n-channel MOSFETS 92 and 94. MOSFETS 84, 86, and 92 form a reference cell 96 which is relatively immune to voltage variations on $V_{dd}$. MOSFETS 88, 90, and 94 form a pseudo current cell 98 which emulates a current cell of the array 14 of FIG. 3. By comparing the output of the reference cell 96 with the pseudo current current cell 98, an error detection signal can be developed.

The reference cell 96, as mentioned above, includes the MOSFETS 84, 86, and 92. The source of MOSFET 84 is coupled to the power line 64, and its gate is coupled to bias line 30. The drain of MOSFET 84 is coupled to the source of MOSFET 86 by a line 100 which, in turn is coupled to line 80. The gate of MOSFET 86 is coupled to line 82 and its drain is coupled to the drain of MOSFET 92. The source of MOSFET 92 is coupled to the ground line 76.

The purpose of the opamp 48 is to make MOSFET 84 operate as a constant current source at a constant voltage. Line 30 is coupled to the gate of MOSFET 84, and line 80 is coupled to its drain. Opamp 48, by definition, will keep the voltages on lines 30 and 80 substantially the same, ensuring that the voltages on the gate and drain of MOSFET 84 are the same. This ensures that the voltage at the drain of MOSFET 84 is fixed at the reference voltage on line 30.

The pseudo current cell 98, as also mentioned above, includes the MOSFETS 88, 90, and 94. The source of MOSFET 88 is coupled to the power line 64 and its gate is coupled to bias line 30. The drain of MOSFET 88 is coupled to the source of MOSFET 90 by a line 102. The gate of MOSFET 90 is coupled to ground line 76, and its drain is coupled to the drain of MOSFET 94 by a line 104. The gate of MOSFET 94 is coupled to the gate of MOSFET 92 by a line 106, and the source of MOSFET 94 is coupled to the ground line 76.

The variation detector 50 is operative to develop an error signal on an output line 108 when an output of the reference cell 96 differs from the output of the pseudo current cell 98. MOSFET 88 is a current source which will vary with variations in $V_{dd}$ in the same way that the current sources in array 14 vary with the variations in $V_{dd}$. MOSFET 90 is always on due to the connection of its gate to the ground line 76. MOSFET 84 is also a current source, but the MOSFET 86, which is coupled to opamp 48, ensures that the current that it provides will not fluctuate with variations in $V_{dd}$. Since MOSFETS 92 and 94 are current mirrors, the current through those transistors must be substantially the same. Therefore, any current difference between the reference cell 96 and the pseudo current cell 98 caused by variations in $V_{dd}$ will flow through output line 108 and into the variation compensator 52.

The variation compensator 52 includes three p-channel MOSFETS 112, 114 and 116 and two n-channel MOSFETS 118 and 120. The sources of MOSFETS 112 and 114 are coupled to power line 64, and their gates are coupled together as current mirrors. The drain of MOSFET 114 is coupled to bias line 30, while the gates of MOSFETS 112 and 114 and the drain of MOSFET 112 are coupled to the source of MOSFET 116 by a line 122. The gate of MOSFET 116 is coupled to ground line 76 and its drain is coupled to the drain of MOSFET 120 by a line 124. The source of MOSFET 120 is coupled to the ground line 76. The gate of MOSFET 120 is coupled to the gate of MOSFET 118 in a current mirror configuration, and to output line 108. The drain of MOSFET 118 is also coupled to line 108 and its source is coupled to ground line 76.

Since MOSFETS 118 and 120 are coupled together as current mirrors, the current flowing through MOSFET 120 will be substantially the same as the error current flowing through MOSFET 118 from line 108. Since MOSFET 116 is always turned on due to grounding of its gate, this error current will be drawn through the MOSFET 112. Furthermore, since MOSFETS 112 and 114 are current mirrors, the current flowing through MOSFET 114 will be substantially the same as the current flowing through MOSFET 112. MOSFET 114 can pull up or push down the voltage level on bias line 30 to compensate for variations in Vdd and to thereby stabilize the voltage level on bias line 30.

While this invention has been described in terms of several preferred embodiments, it is contemplated that alterations, modifications and permutations thereof will become apparent to those skilled in the art upon a reading of the specification and study of the drawings. It is therefore intended that the following appended claims include all such alterations, modifications and permutations as fall within the true spirit and scope of the present invention.

What is claimed is:

1. A digital-to-analog converter comprising:
   decoder means responsive to a multi-bit digital input and operative to decode said digital input into a plurality of cell activation signals;
   conversion means comprising a plurality of current cells, where each of said current cells includes a cell bias input, a cell activation input, and a cell analog output, wherein said cell analog outputs of said plurality of current cells are coupled together to provide a converter analog output;
   bias generator means having a reference input coupled to a bias generator voltage reference source, a bias output coupled to the cell bias inputs of said plurality of current cells, and a power input;
   variation detection means coupled to said power input for detecting a voltage variation on said power input and operative to develop an error signal in response to said voltage variation; and
   variation compensation means responsive to said error signal and operative to vary said bias output to compensate for said voltage variation, wherein an input of said variation compensation means is coupled to said error signal and an output of said variation compensation means is coupled to said bias output.

2. A digital-to-analog converter as recited in claim 1 further comprising means for developing a compensation reference voltage, wherein said variation detection means is further responsive to said compensation reference voltage.

3. A digital-to-analog converter comprising:
   decoder means responsive to a multi-bit digital input and operative to decode said digital input into a plurality of cell activation signals;
   conversion means comprising a plurality of current cells, where each of said current cells includes a cell bias input, a cell activation input, and a cell analog output, wherein said cell analog outputs of said plurality of current cells are coupled together to provide a converter analog output;
   bias generator means having a reference input coupled to a bias generator voltage reference source, a bias output coupled to the cell bias inputs of said plurality of current cells, and a power input;
   compensation means coupled to said bias generator comprising means for detecting a voltage variation on said power input and means for varying said bias output of said bias generator to compensate for said voltage variation; and
   means for developing a compensation reference voltage including operational amplifier means; and
   means for disabling said operational amplifier means.

4. A digital-to-analog converter as recited in claim 2 wherein said variation detection means includes:
   reference cell means coupled to said compensation reference voltage;
   pseudo current cell means; and
   means comparing an output of said reference cell means against an output of said pseudo current cell means and developing said error signal.

5. A bias compensator comprising:
   variation detection means coupled to a bias line and a power input and operative to develop an error signal in response to voltage variations on said power input; and
   variation compensation means responsive to said error signal and operative to vary the voltage on said bias line to compensate for said voltage variation, wherein an input of said variation compensation means is coupled to said error signal and an output of said variation compensation means is coupled to said bias line.

6. A bias compensator as recited in claim 5 further comprising means for developing a reference voltage and wherein said variation detection means is further responsive to said reference voltage.

7. A bias compensator comprising:
   variation detection means coupled to a bias line and a power input and operative to develop an error signal in response to voltage variations on said power input;
   variation compensation means responsive to said error signal and operative to vary the voltage on said bias line to compensate for said voltage variation; and
   means for developing a compensation reference voltage including operational amplifier means; and
   means for disabling said operational amplifier means.

8. A bias compensator as recited in claim 6 wherein said variation detection means includes:

reference cell means coupled to said reference voltage;
pseudo current cell means; and means comparing an output of said reference cell means against an output of said pseudo current cell means and developing said error signal.

9. A method for providing a stable bias voltage comprising:
developing a bias voltage from a power supply;
sensing voltage variations in said power supply by comparing an output of a pseudo circuit coupled to said power supply against the output of a reference circuit coupled to said power supply to develop an error signal indicative of variations of said bias voltage; and
compensating said bias voltage to counteract the effects of said voltage variations by utilizing a compensation circuit, the error signal being utilized as an input to the compensation circuit and the bias voltage being coupled to an output of the compensation circuit.

* * * * *